(12) United States Patent
Raymond

(10) Patent No.: US 11,908,965 B1
(45) Date of Patent: Feb. 20, 2024

(54) SOLAR PHOTOVOLTAIC (PV) PANELS OR DEVICES WITH INFRARED (IR) REFLECTING FILMS FOR ENHANCED EFFICIENCY

(71) Applicant: Lumenco, LLC, Englewood, CO (US)

(72) Inventor: Mark A. Raymond, Littleton, CO (US)

(73) Assignee: Lumenco, LLC, Englewood, CO (US)

( * ) Notice: Subject to any disclaimer, the term of this patent is extended or adjusted under 35 U.S.C. 154(b) by 0 days.

(21) Appl. No.: 18/122,327

(22) Filed: Mar. 16, 2023

(51) Int. Cl.
*H01L 31/052* (2014.01)
*G02B 5/08* (2006.01)
*H01L 31/054* (2014.01)

(52) U.S. Cl.
CPC .......... *H01L 31/052* (2013.01); *G02B 5/0816* (2013.01); *H01L 31/054* (2014.12)

(58) Field of Classification Search
CPC .... H01L 31/052; H01L 31/054; G02B 5/0816
See application file for complete search history.

(56) References Cited

U.S. PATENT DOCUMENTS

2008/0163929 A1* 7/2008 Krasnov ............. H01L 31/1884
136/265
2021/0280732 A1* 9/2021 Abouraddy ..... H01L 31/022483

FOREIGN PATENT DOCUMENTS

WO WO-2022249112 A1 * 12/2022

* cited by examiner

*Primary Examiner* — Mayla Gonzalez Ramos
(74) *Attorney, Agent, or Firm* — Hall Estill Law Firm

(57) ABSTRACT

A solar or photovoltaic (PV) system that includes a PV device with an upper surface configured for receiving sunlight and converting the received sunlight into electrical energy. An infrared (IR) reflecting film is placed over the upper surface to increase the efficiency of the PV device by retaining its operating temperature in more desired ranges. The IR reflecting film includes a substrate with a top surface and a bottom surface, and the bottom surface is mated with the upper surface of the PV device. The IR reflecting film also includes a plurality of structures, each with a recessed surface, formed on the top surface of the substrate. The IR reflecting film includes a reflective mask on the top surface of the substrate that includes reflective elements each disposed in the structures' recessed surfaces. In use, the IR reflecting film reflects sunlight having a wavelength greater than about 950 nanometers (nm).

25 Claims, 7 Drawing Sheets

Linear Version Side View

SOLAR PHOTOVOLTAIC (PV) PANELS OR DEVICES WITH INFRARED (IR) REFLECTING FILMS FOR ENHANCED EFFICIENCY

BACKGROUND

1. Field of the Description

The present description relates, in general, to design and manufacture of solar photovoltaic (PV) panels, devices, films, cells, or materials (which may be used interchangeably as well as with simply "photovoltaics" or "solar panels"), and, more particularly, to photovoltaics configured to control heat absorption or heating so as to increase the efficiency of the photovoltaics that may be used for panels, enhancements, building materials, PV components for automobiles, windows, and nearly any other PV-including device or layer.

2. Relevant Background

In the past decades, there has been great increases in the use of solar energy as a renewable energy source. However, there continues to be a significant demand for new ways to collect solar energy and to do so in a more efficient manner.

In general, photovoltaic materials and devices convert sunlight into electrical energy. A single PV device is known as a cell and is usually small, typically producing about 1 or 2 Watts of power. These cells are made of different layers of semiconductor materials and are often less than the thickness of four human hairs. To enhance durability, cells are typically sandwiched between protective materials in a combination of glass and/or plastics that are transparent to the sunlight. To boost the power output of PV cells, they are connected together in chains to form larger units known as modules or panels. Panels are used individually or are connected together to form arrays. The arrays are then connected to the electrical grid as part of a complete PV system. Because of this modular structure, PV systems can be built to meet almost any electric power need.

Solar or PV cell efficiencies vary from about 6 percent for amorphous silicon-based solar cells to about forty-four percent with multiple-junction production cells. However, solar cell energy conversion efficiencies for commercially available multicrystalline Si solar cells are around fourteen to nineteen percent, and, unfortunately, the highest efficiency cells have not always been the most economical as they may require exotic and/or expensive materials to manufacture. These relatively low efficiencies of PV cells and, hence, most PV materials or devices have caused those in the solar power industry to continually search for ways to improve PV materials to achieve higher and higher efficiencies without unduly raising the cost of manufacture or undesirably affecting the durability or life of the PV materials.

SUMMARY

The inventors recognized that it would be beneficial to provide a thin film or layer over most photovoltaics or photovoltaic (PV) devices such as solar panels to block or reflect the portion of sunlight that is difficult to absorb and that is undesirably converted into heat, thereby reducing the efficiency and life of the PV devices. In response, the inventors created an infrared (IR) reflecting film that is uniquely designed to reflect a large portion of the sunlight in the IR wavelength range (i.e., light with wavelengths longer than about 950 nanometers (nm)) while transmitting most of the visible light that can be converted effectively to electrical energy by an underlying PV device.

According to some preferred practical implementations of the inventors' ideas, a PV-based system is described that includes a PV device with an upper surface configured for receiving sunlight and converting the received sunlight into electrical energy. Significantly, the system includes an infrared (IR) reflecting film to increase the efficiency of the PV device by retaining its operating temperature in more desired ranges. The IR reflecting film includes a substrate with a top surface and a bottom surface, and the bottom surface is mated (e.g., with light transmissive-to-transparent adhesive) with the upper surface of the PV device. The IR reflecting film also includes a plurality of structures, each with a recessed surface, formed on the top surface of the substrate. Importantly, the IR reflecting film further includes a reflective mask on the top surface of the substrate, with this mask provided by a plurality of reflective elements each disposed in one of the plurality of structures on its recessed surface (e.g., at the bottom of a groove for a linear structure or lower surfaces of a hexagonal structure). The reflective mask is configured such that the IR reflecting film reflects a portion of the sunlight having a wavelength greater than about 950 nanometers (nm). For example, the IR reflecting film may function to reflect at least 50 percent of the IR in the sunlight striking the PV device.

In practice, the recessed surfaces in the structures are linear or round, hexagonal, or square in shape. Further, the reflective elements may have a maximum dimension of less than about 400 nm. In some preferred embodiments, the maximum dimension is less than about 100 nm and light reflectance from the top surface of the substrate of the IR reflecting film is provided by less than 10 percent of a surface area of the top surface.

In some embodiments, the reflective elements each are provided by a layer of a metal or a meta material with a thickness of less than about 0.1 micron. In such cases, the reflective elements may be formed of a material and thickness so as to transmit 20 to 50 percent of the sunlight with a visible light wavelength. For example, they may each be formed of a thin film or layer of metal such as aluminum. In these or other cases, the IR reflecting film further includes, over each of the reflective elements, a protective coating comprising at least one resist material.

It is likely that in many situations, the PV device will take the form of a solar panel, and the upper surface of the PV device will be an outer surface of a protective layer (e.g., a protective glass layer that is common with many solar panels). In other embodiments, the PV device is replaced by a building material such as a synthetic decking material with the IR reflecting layer applied to an outer, sun-facing surface of this building material or in a sublayer so as to be protected from foot traffic or other wear.

DETAILED DESCRIPTION OF THE PREFERRED EMBODIMENTS

Briefly, the following description teaches new solar photovoltaics or PV materials or devices (which include solar panels, solar cells, and nearly any PV-based component, product, or system) that include one or more infrared (IR) films to control heat absorption or build up and, thereby, increase the efficiencies of the new solar photovoltaics or PV materials. The description also teaches a method for fabricating the IR films, which can then be applied to previously manufactured solar photovoltaics or which can be provided as part of the initial manufacturing process for the solar photovoltaics. The following paragraphs begin with an explanation of how the inventors created or designed the new IR film and its associated manufacturing methods and then proceeds to specific implementation examples for the IR film.

De-metallization has been used for anti-counterfeiting features and other features for aesthetic effects for packaging and other uses. Traditionally, aluminum, copper, titanium, chromium, and other metals are applied to films using a vapor deposition or sputtering system at various optical densities. Then, a resist material is printed over the metal using various methods such as gravure or flexography though digital printing and offset methods. Most often, an ultraviolet (UV) chemistry is used in the form of a UV spot coating. This "resist" coating is applied in the areas in which the metal is desired and where it should remain. Next, the web is generally coated or sent through a bath of water and sodium hydroxide (generally the mixture is 1% to 20% sodium hydroxide mixed with water). The solution is usually heated to between 100° F. to 150° F. and run through a few water rinsing processes. The metal under the resist printing is generally protected.

Figure 1:
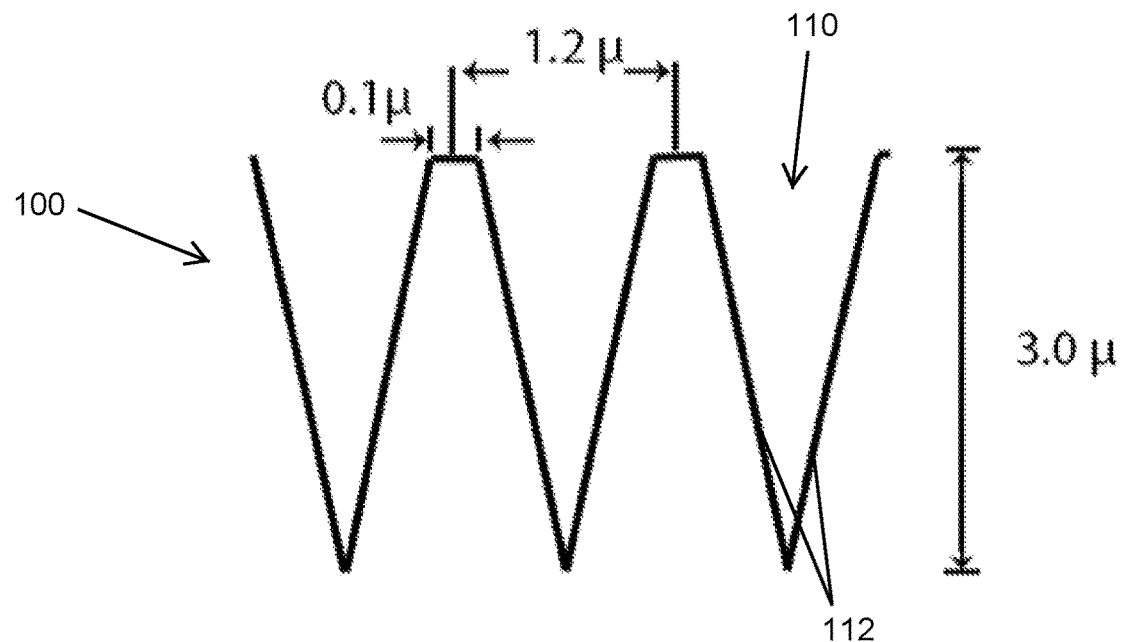
FIG. 1 illustrates a side or end view of a film or device layer that can be formed by de-metallization to have linear, V-shaped grooves or recessed portions (or "microstructures")

Linear grooves or round, hexagonal or square microstructures are formed generally using a silicon wafer and electron beam imaging or etching process. For example, FIG. 1 illustrates, with a linear side or end view, a film (or layer of a device) 100 with a plurality of side-by-side linear grooves 110 defined by opposing sidewalls 112 to provide a V-shaped sectional shape in this non-limiting example. Exemplary dimensions are provided for the width and height of the groove 110 was well as for the spacing between adjacent grooves 110 in the film, wafer, or layer 100 (groove 110 may be formed in a top or outer surface of the body or substrate of the film 100). Such a fabrication process is necessary or better than using a traditional laser system due to the feature size and necessary specifications for the tooling, which involves sub-micron features with three-dimensional (3D) etching and aspect ratios that are generally deeper than their X or Y axis.

Figure 2:
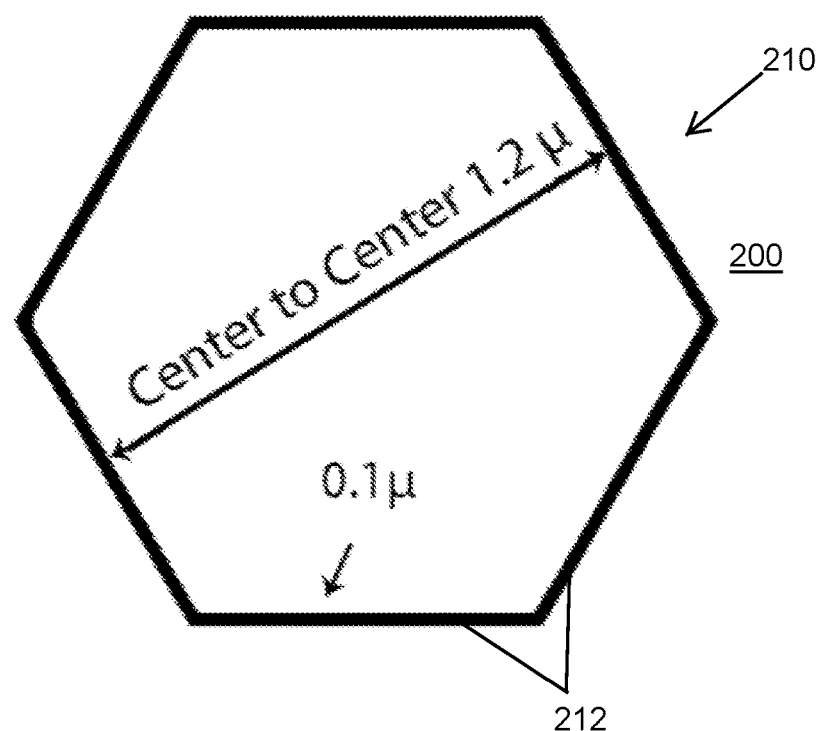
FIG. 2 is a top view of a film or device layer that can be formed by de-metallization to have hexagonal shaped grooves or recessed portions (or "microstructures")
Figure 3:
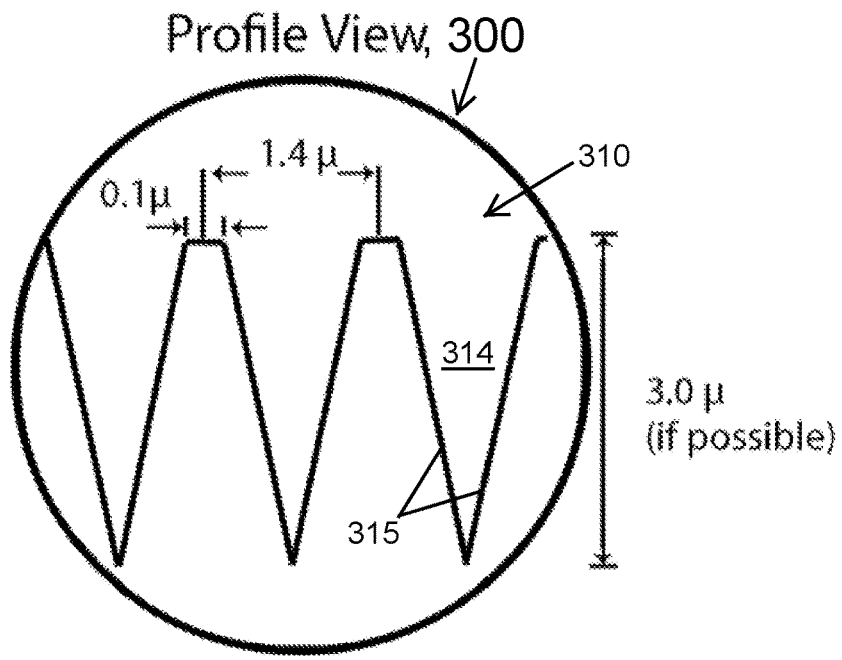
FIG. 3 is a microscope view of another film or device layer similar to FIG. 1 but with linear grooves or microstructures of differing widths.

An overhead or top view of a film or device layer 200 with microstructures (or grooves or recessed portions) 210 of a hexagonal shape defined by sidewalls 212, with one being shown for simplicity of illustration with the understanding that many more would typically be formed on the upper surface of the film/layer 200. Dimensions for the microstructure 210 are shown in FIG. 2 including the center-to-center distance of 1.2 micrometers and the length of the sidewalls 212 of 0.1 micron. The other aspect ratios of depth need for the wafer (or film or layer) are generally 2 to 1 (depth to X or Y axis) and preferably 3 to 1. An overhead view 300 from an SEM microscope of a film or layer 310 similar to that shown in FIG. 1 is provided in FIG. 3, with the top surface of the film/layer 310 shown to include a plurality of linear grooves or microstructures 314 defined by sidewalls 315. The grooves 314 have similar height and spacing to those shown in FIG. 1 but with a differing width (e.g., 1.4 microns rather than 1.2 microns).

Generally, the next step in the process is to electroform the tool into a master nickel tool that can be copied or replicated hundreds of times. This tool is generally used to create a larger tool via a step and repeat process using UV polymers or heat and pressure, replicating the original tool as perfectly as possible to make a large production shim or tool that can be mounted on a cylinder for production. In a preferred method of cast and cure, a base film in a roll is coated and the micro or nanostructures are cured through the clear film and the UV resin so that a perfect copy of the 3D image is replicated. Then, a film such as PET, fluoropolymer or any film can be processed through a cast and cure method replicating the structures or negative of the structures onto the film. Speeds in this roll-to-roll operation generally are 20 to 150 meters per minute and can be done over two meters wide.

Per the above explanation, the structures are then metallized generally with aluminum at the desired optical density at generally less than 100 nm in thickness but up to 300 nm. Generally, this is done via vacuum metallization or deposition or sputtering at high speeds in a roll-to-roll operation. Some vacuum metallization lines can run over 2000 meters per minute.

Figure 4:
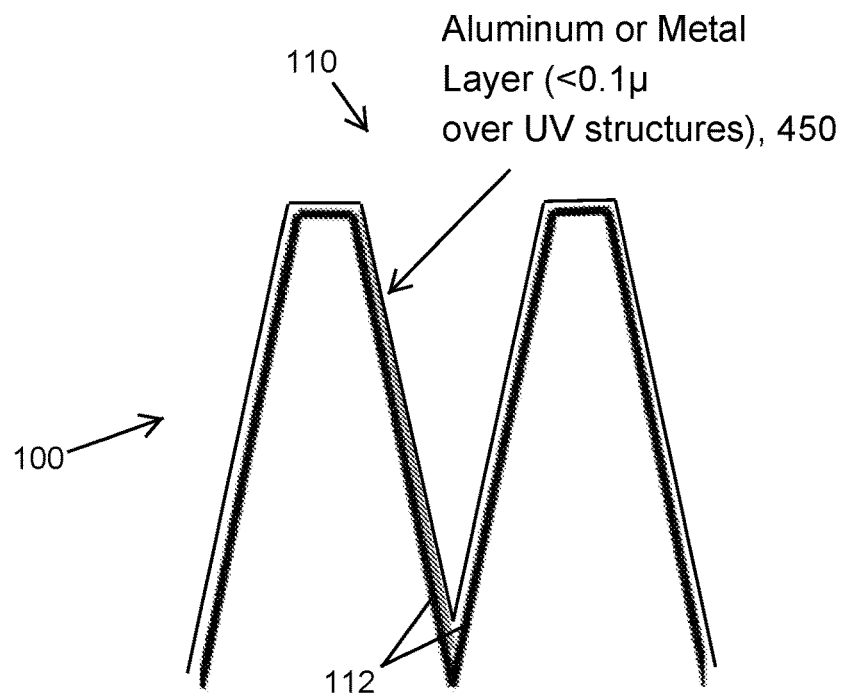
FIG. 4 illustrates the film or device layer of FIG. 1 after metallization has been performed to provide a top or covering metallic layer.

After metallization, the structures generally are covered but not "filled" as the aluminum or other metal conforms to the shape of the structure providing a metal covering or top layer but leaving cavities in either rows or shapes as discussed above with reference to FIGS. 1-3. For example, FIG. 4 illustrates the film or device layer 100 of FIG. 1 after metallization has been performed to provide a top or covering metallic layer 450 that covers the grooves or microstructures such as groove 110 as well as the surfaces between these microstructures (or groove tips). The thickness of the metal covering or top layer 450 may vary with less than about 0.1 microns shown in FIG. 4.

Figure 5:
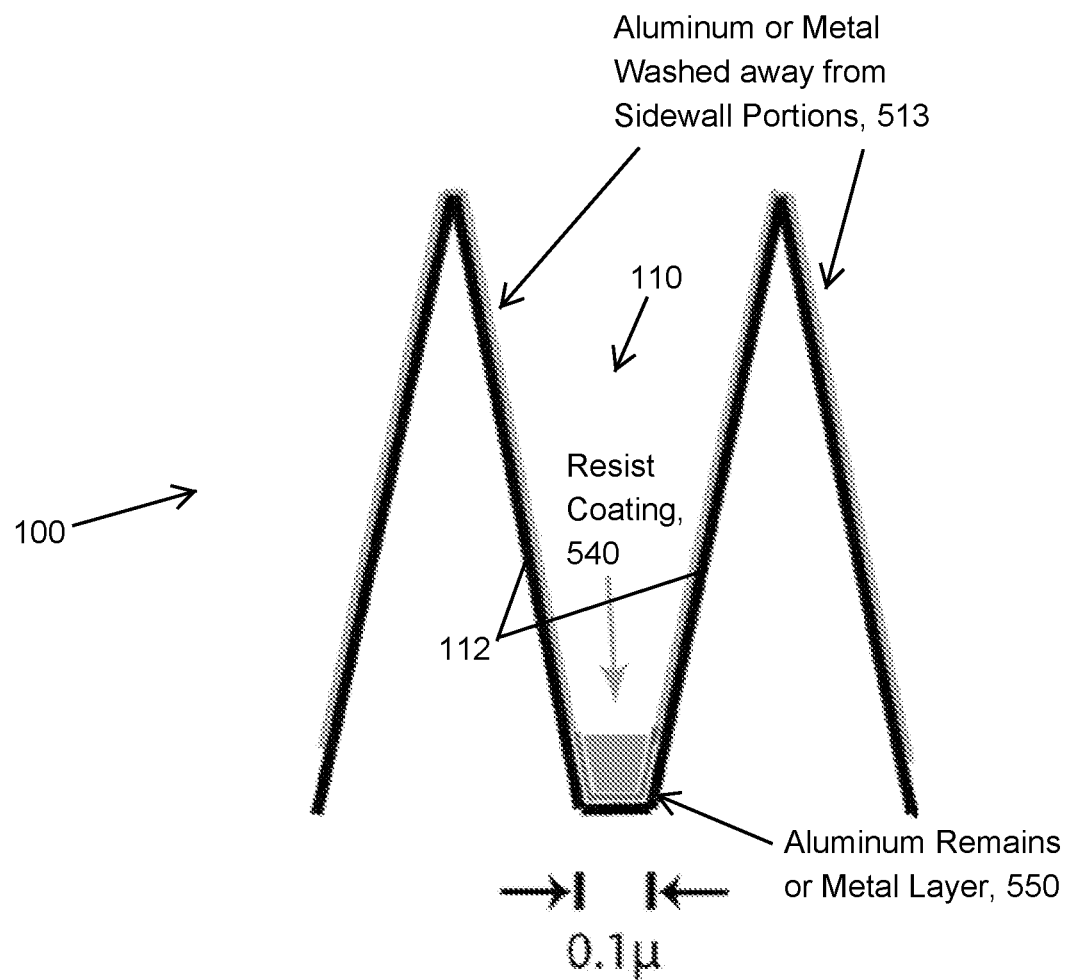
FIG. 5 illustrates the film or device layer of FIG. 4 after application of a resist coating and removal of the metal upper or coating layer except where covered by the resist coating.

The next challenge is to fill the very narrow shapes with a resist material (e.g., chemical resist) that can be UV, solvent, or water based. FIG. 5 illustrates the film or device layer 100 of FIG. 4 after application of a resist coating 540 in the bottom of the groove or microstructure 110 and after removal of the metal upper or coating layer except where covered by the resist coating as shown in FIG. 5 as sidewall portions 513 to include the entire sidewalls 512 except for the very lower portion (which may be V-shaped or more U-shaped as shown in FIG. 5 with a lower width of about 0.1 microns, in this example). Note that this is generally the "negative" of the other images in previous diagrams The cavities are filled only at the base of the structures 110 (or 212 in FIG. 2) with the resist material 540 applied in some cases in a roll-to-roll process that leaves the resist material in the cavities and does not leave residue on the rest of the aluminum or metal layer (layer or coating 450 shown in FIG. 4).

In the next process per the above, the roll or layer/film 100 is processed through a combination of sodium hydroxide and water or other cleaning solvents that will remove the aluminum or metal layer from sidewall portions 513 and not the resist coating 540, protecting the aluminum or metal layer 550 underneath the resist 540 and forming an "encapsulated" aluminum or metal layer 550 as shown in FIG. 5.

Figure 6:
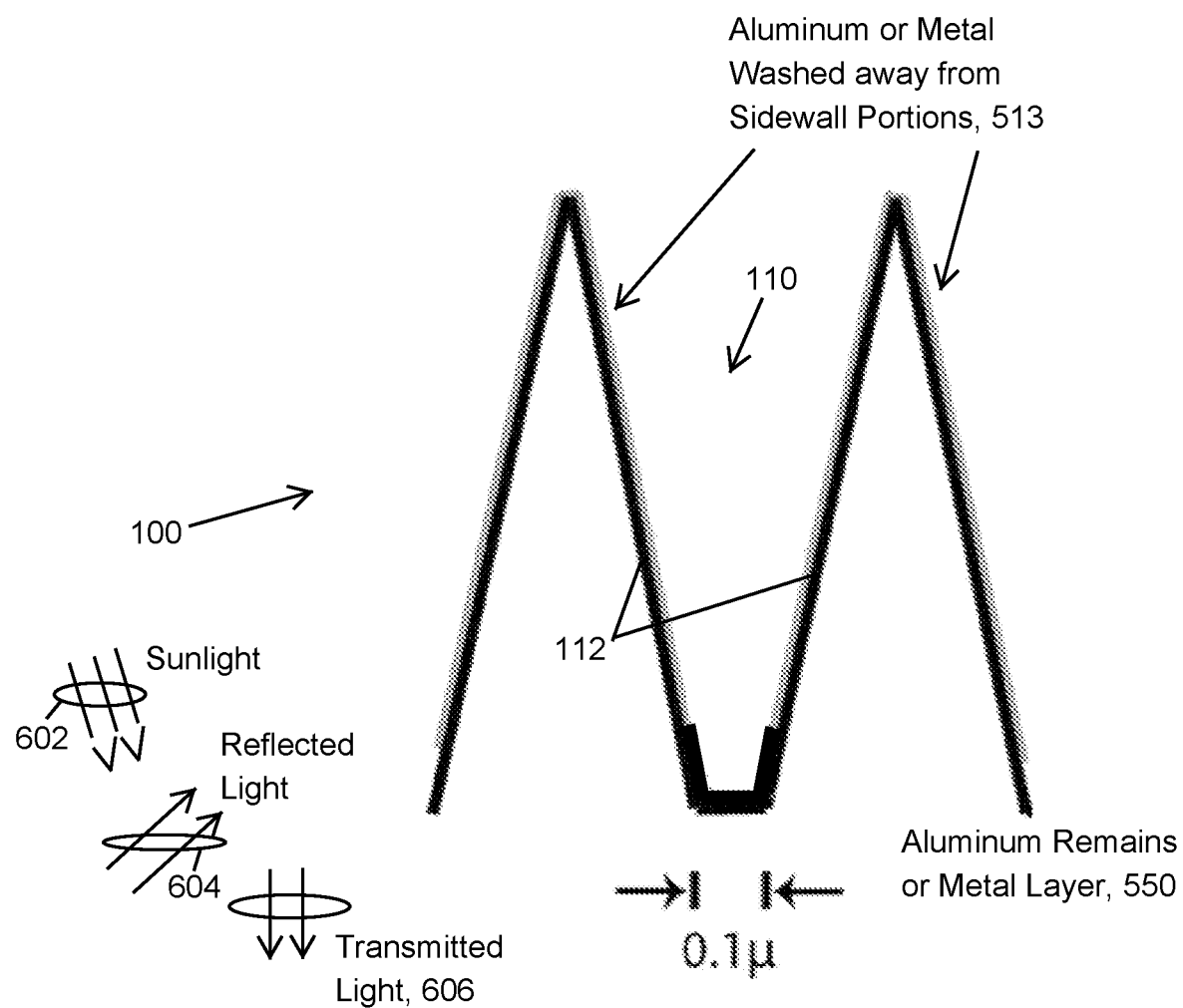
FIG. 6 illustrates the film or device layer of FIG. 5 after removal of the resist coating and during use to reflect higher wavelength (or heat generating) light such as that of the IR wavelength or longer.

Significantly, the resulting film or layer 100 has a nanostructured aluminum or other metal layer or "mask" 550. Particularly, FIG. 6 illustrates the film or device layer 100 of FIG. 5 after removal of the resist coating 540 and during use to receive sunlight 602, reflect higher wavelength (or heat generating) light 604 such as that of the IR wavelength or greater wavelengths, and to transmit light below higher wavelength (e.g., visible light with a wavelength below that of IR light).

As a result, the film or layer 100 with its microstructures 110 including the metal masks 550 in the microstructures 110 can be applied to a PV panel or to PV material, and the fabricated film 100 may be thought of as an IR reflector element or thin film (or layer) that can be applied over an outer layer or surface of nearly any photovoltaics such as a PV panel or the like. In one useful embodiment, the layer 100 will not allow wavelengths longer than about 950 nm into the solar absorber and will reflect the IR (as shown with arrows 604 in FIG. 6) back into space or the atmosphere. Hence, the underlying solar panel or other photovoltaics does not heat up via absorption of IR light. Since the atmosphere is about 6,300 miles thick and the IR reflects at about 186,000 miles per second and takes about 0.03 seconds to exit the atmosphere on a clear day, the IR reflective film or layer 100 can act as a heat exchanger to cool the solar panel (or other photovoltaics that includes the film or layer 100) often dropping the temperature of the panel below the temperature of the ambient air using the "night sky" acting as a heat exchanger with space.

One unique idea of the inventors is that a reflective mask is created in the process discussed above with the formation of film/layer (or "IR reflector element") 100 The "reflective mask" is provided by a combination of all the remaining pieces or portions (or remains) of the metal layer 550 on the top surface (sunlight-facing surface when installed or in use) of the film (or substrate of silicon or other light transmissive (e.g., nearly transparent) material) 100. The reflective mask blocks or reflects very little visible light and, therefore, allows the visible light into the photovoltaic panel, film, or absorber with only small loss while not allowing wave lengths longer than a predefined maximum transmitted light wavelength, which may be about 950 nm in some preferred embodiments, into the absorber or panel that would be provided underneath the IR reflector film 100.

This is a very useful configuration of a solar panel because, generally, solar panels cannot absorb wavelengths longer than about 950 nm. By reflecting the IR wavelengths or heat with the addition of the IR reflective film 100, the solar panel stays cool during use and continues to operate at peak efficiency. Generally, about ten percent or less of the top surface of the reflector 100 is covered by the reflective mask that reflects wavelengths of visible light (400 to 700 nm). Further, a metal may be chosen for the reflective mask to achieve less loss of visible light that can be absorbed by the solar panel. For example, the optical density of aluminum may make it useful for the reflective mask as it reflects all or nearly all of longer wavelengths (e.g., those longer than about 950 nm) yet allows over half of the visible light through the aluminum reflective mask resulting in less than a five percent loss of visible light into the photovoltaic device due to the addition of the IR reflective film 100 of FIG. 6.

Figure 7:
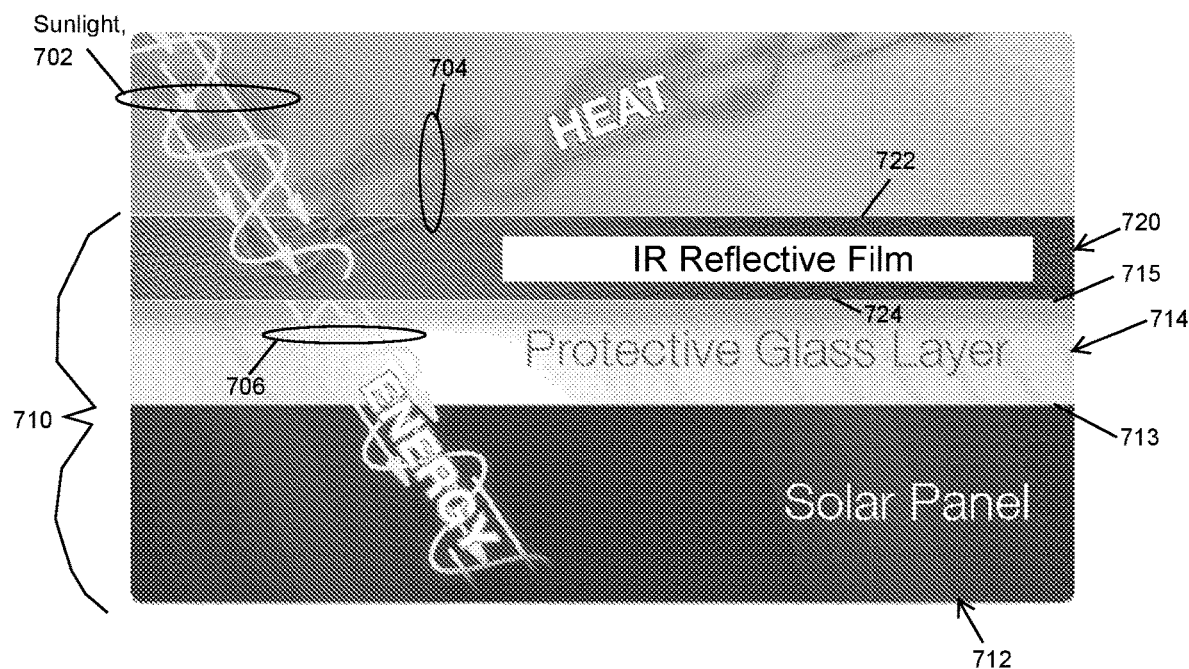
FIG. 7 illustrates a side view of a solar system or product incorporating an IR reflective film or layer of the present description.

The film or layer with the reflective mask in bottom surfaces of microstructures formed on its top surface can be applied to an existing panel, e.g., over the protective glass layer or film (diagram 7) or may be incorporated into a new panel construction with similar positioning. For example, FIG. 7 illustrates a side view of a solar system or product 710 incorporating an IR reflective film or layer 720 of the present description. The film or layer 720 would include a reflective mask as described above on its top or outer surface 722 and, typically, have a planar bottom or inner surface 724 to facilitate mating with outer surfaces of photovoltaics. The IR reflective film 720 may take the form of film 100 described with reference to FIG. 6 or may include differing shaped microstructures, such as those described with reference to FIG. 2 and, hence, a differently configured reflective mask.

As shown, the solar panel 712 includes a protective glass layer 714 on its top or outer surface 713. The IR reflective film 720 would be applied with its bottom or inner surface 715 abutting the planar top or outer surface 715 of the glass (or other transparent material) layer 714. Typically, an adhesive may be used that is selected to be durable for outdoor use while also being transparent (or substantially so) to light. During use, as shown, sunlight 702 strikes the top or outer surface 722 of the IR reflective film 720. This surface 722 includes the microstructures described above combined with the reflective mask (or metallic elements or remains after a de-metallization process), and, as a result, the IR light (or light with a wavelength of 930 nm or longer) is reflected from the top surface 722 of the film 270 as shown with arrows 704 while all or a large portion (e.g., 90 percent or more) of the shorter wavelength light (e.g., light with a wavelength of less than 980 nm) is transmitted through the surface 722 and substrate or body of the film 720 onto the glass layer 714 and then to the solar panel 712 for conversion into electric power.

Figure 8:
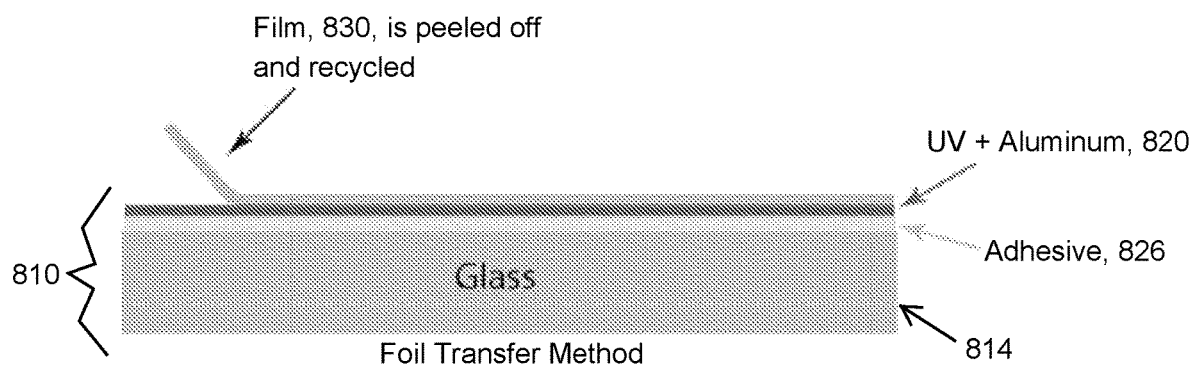
FIG. 8 illustrates with a simplified schematic end view a foil transfer method for forming a solar panel or other PV device that includes an IR reflective mask of the present description.

FIG. 8 illustrates, with a simplified schematic end view, a foil transfer method for forming a solar panel or other PV device 810 that includes an IR reflective film 820 of the present description. A film 820 can be made into a transfer foil 830 eliminating the foil by using a release coating on the PET or film 820 before it is sent through the cast and cure process. Then, an adhesive 826 is applied over the cast and cure nano structures with aluminum (i.e., the reflective mask) in IR reflective layer/film 820. The release liner and the film 820 is applied to the glass or panel 814 and pressed into place. The film/foil 830 is then removed and the adhesive 826 along with the cast and cure energy polymer and aluminum (or IR reflective film) 820 remains on the panel 814 with a total thickness of generally under 100 microns.

Figure 9:
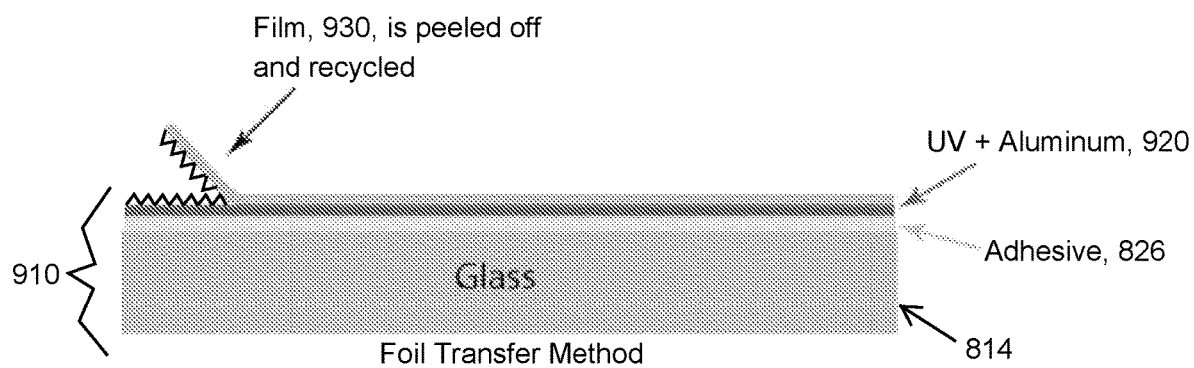
FIG. 9 illustrates a second foil transfer method similar to FIG. 8 to provide the surface features combined with an optical mask for IR reflection.

FIG. 9 illustrates a second foil transfer method similar to FIG. 8 to provide the surface features combined with an optical mask for IR reflection, with like numbered components having like numbers in FIGS. 8 and 9. As shown, a PV device 910 is formed that includes an IR reflective film 920. The film 920 can be made into a transfer foil 930 as discussed above with reference to FIG. 8 with an adhesive 826 being used to apply the film 920 to the surface of the glass layer or panel 814. In the PV device 910, additional optical structures are provided as shown in the carrier film 920 (e.g., the optical structures taught in U.S. Pat. No. 8,921,681, which is incorporated herein by reference). For example, the method shown schematically in FIG. 9 may be successfully used to provide structures such as linear or pyramidal structures that are pre-embossed in the surface of the carrier film 930 that is placed against the IR film/reflective layer 920.

Generally, material selection for photovoltaics including solar panels is done using Teflon materials, fluoropolymers, and other materials that are designed for outside use and have been tested as effective outdoors for up to 40 years. Since solar panels cannot absorb the longer wavelengths that contain heat or infrared, the sun's rays heat the panel to more than 150° C. in some environments. One well-known or standard equation for photovoltaic losses is 0.5% (or slightly higher) per degree increase Celsius above 25° C. (see, for example, "Thermal Behavior of Photovoltaics" readily available online). Therefore, a 100-degree Celsius panel will lose 37.5% of its efficiency at 150° C. in a desert condition. Even in moderate climates the panel can exceed 75° C. losing 25% efficiency. Hence, a key challenge is keeping the solar panel cool so that it can maintain efficiency. Since the normal band gap for photovoltaics allows the absorption and energy conversion of only visible light, the IR or infrared is detrimental to energy conversion.

Further, heat is a primary reason that photovoltaic panels have a limited lifespan. The "rule of thumb" in the solar power industry is that near room temperature reaction rates frequently double for each 10 percent increase in temperature (see, for example, Pauling 1988). Applying this "rule of thumb" to the degradation process of determining the life of a solar module, modular life could be considerably extended with even a modest reduction in its operating temperature. For example. a 1-degree Celsius decrease in the operating temperature of a solar panel could extend its lifetime by about 7 percent or by about 2 years. A 10-degree Celsius drop in operating temperature can extend the panel lifetime by 20 years. Significantly, the use of the new IR reflective film or reflective mask technology is expected by the inventors to drop the operating temperature of a solar panel more than 20° C., which would greatly increase the solar panel's expected life especially in hotter climates in which they are in greater use.

The IR reflective or reflecting film described herein can be used in other products than solar panels and can also be combined with UV blocking chemistry. Other uses are in synthetic decking materials where the film can be integrated or co-extruded into the composite such as into Trex® and other decking materials. By integrating the film (e.g., as an outer layer or a sublayer), it would keep the decking relatively cool in the sun as it would reflect the IR and extend the lifetime of the decking material or building material. The IR reflective or reflecting film can also be applied directly to thin film photovoltaics such as amorphous silicon, CIGS, organics and perovskite films and absorbers, and this film can act as the primary film to carry the absorbers along with the nanostructured aluminum.

Further, additional structures can be applied or integrated into the heat reflecting film such as pyramidal structures shown to elongate the pathlength of the photon and enhance the acceptance angles in off angle photovoltaic performance. These top structures can also be made of Teflon chemistries and even glass for longevity. The additional structures provided in the IR reflective or reflecting film may be the structures taught in U.S. Pat. No. 8,921,681, which is incorporated by reference in its entirety.

The IR reflecting films may take a variety of forms and provide a number of unique advantages in its functionality when used in solar and building materials or products. The reflective mask may use (or be formed using) linear microstructures that allow less than 2-micron wavelengths of light into the panel or material with less than 1 micron preferred in some cases. The film may use or include nonlinear shapes to form the reflective mask such as round, hex, square and other mask shapes. In brief, the IR reflecting or reflective films taught herein are configured and manufactured to reflect over 50 percent of the IR wavelengths over about 950 nm. The reflective mask may include reflective material elements or features in lower or bottom surfaces of the microstructures that are up to 4 microns in maximum dimension.

In some manufacturing implementations, the method of fabricating or forming the IR reflecting film may use wafers or resist tools that have originations of more than 1 to 1 (depth to width or X or Y axis) with preferably up to about 2 or 3 to 1 (depth to width). The IR metalized material can be aluminum or any reflective material, and, in some useful embodiments, the reflective material may be provided through the use of meta materials in place of aluminum for maximum reflectance. The metal or reflective can be formed in or provided by the reflective mask in strips or shapes that are less than about 400 nm in maximum dimension and are preferably, in some cases, less than about 100 nm, with one goal of the IR reflecting film design being to maximize the passage of visible light while keeping the visible light reflectance down to 10 percent or less of the surface area.

As discussed, the reflective mask may be formed using aluminum or other reflective materials (e.g., metals) that reflect infrared light but still allow some visible light to be transmitted through the reflective mask, such as lower optical density aluminum or other metal depositions. The fabrication process may involve encapsulating the aluminum or reflective material in a coating, which may be an energy-cured polymer or other material that protects the aluminum or reflective material during the de-metallization process involving use of sodium hydroxide or other solvents to clean the excess aluminum or other reflective material from the top surface of the thin film or layer.

In some implementations, the resist material is not removed as shown in FIG. 6 but is left in place. This provides an IR reflective or reflecting film 100 as shown in FIG. 5. The encapsulation of the metal or other reflective material acts to protect it from oxidization and the weather using the resist materials, which may take a variety of forms such as those provided by UV, E-beam, solvent, or water-based systems of chemistry.

The fabrication or manufacturing methods for the new IR reflective or reflecting film may include one or more of the following: (a) the use of Ebeam imaging for making the wafer material or tooling; (b) the use of fluoropolymer films and/or coatings in the process of manufacturing; (c) using a roll-to-roll process for the film casting and coating processes; (d) converting the film to a foil transfer material rather than a film; (e) using the IR reflecting film as a carrier for CIGs, perovskite, and any other thin film photovoltaic absorber; (f) applying the film or transfer on top of glass in retrofit for existing solar panels; (g) integrating the film into the solar panel construction under the glass; (h) integrating the film or foil into building materials, especially decking materials, to eliminate or reduce heat including window films; (i) integrating or retrofitting of the film into arrays utilizing sun tracking devices; (j) using a cast and cure energy-cured system to replicate the structures; (k) extrusion embossing the structures; (l) thermoforming the structures; and (m) using any resist coating to protect the aluminum or metal during processing.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A photovoltaic (PV) system, comprising:
    a PV device with an upper surface configured for receiving sunlight and converting the received sunlight into electrical energy; and
    an infrared (IR) reflecting film, comprising:
        a substrate with a top surface and a bottom surface, wherein the bottom surface is mated with the upper surface of the PV device,
        a plurality of structures, each with a recessed surface, formed on the top surface of the substrate, and
        a reflective mask on the top surface of the substrate comprising a plurality of reflective elements each disposed in one of the plurality of structures on the recessed surface,
    wherein the IR reflecting film reflects a portion of the sunlight having a wavelength greater than about 950 nanometers (nm).

2. The PV system of claim 1, wherein the portion of the sunlight reflected is at least 50 percent.

3. The PV system of claim 1, wherein the recessed surfaces of the structures are linear, round, hexagonal, or square in shape.

4. The PV system of claim 3, wherein the reflective elements have a maximum dimension of less than about 400 nm.

5. The PV system of claim 4, wherein the maximum dimension is less than about 100 nm and light reflectance from the top surface of the substrate of the IR reflecting film is provided by less than 10 percent of a surface area of the top surface.

6. The PV system of claim 1, wherein the reflective elements each comprises a layer of a metal or a meta material with a thickness of less than about 0.1 micron.

7. The PV system of claim 6, wherein the reflective elements transmit 20 to percent of the sunlight with a visible light wavelength.

8. The PV system of claim 6, wherein the metal is aluminum.

9. The PV system of claim 1, wherein the PV device comprises a solar panel and wherein the upper surface of the PV device is an outer surface of a protective layer.

10. The PV system of claim 1, wherein the IR reflecting film further comprises, over each of the reflective elements, a protective coating comprising at least one resist material.

11. A reflective film for reflecting IR for use with photovoltaics and building materials, comprising:
    a substrate with a top surface and a bottom surface;
    a plurality of structures, each with a recessed surface, formed on the top surface of the substrate; and
    a reflective mask on the top surface of the substrate comprising a plurality of reflective elements each disposed on the recessed surface of one of the plurality of structures,
    wherein the IR reflecting film reflects at least 50 percent of light received on the top surface having a wavelength greater than about 950 nanometers (nm).

12. The reflective film of claim 11, wherein the recessed surfaces of the structures are linear, round, hexagonal, or square in shape and wherein the reflective elements have a maximum dimension of less than about 400 nm.

13. The reflective film of claim 12, wherein the maximum dimension is less than about 100 nm and light reflectance from the top surface of the substrate of the IR reflecting film is provided by less than 10 percent of a surface area of the top surface.

14. The reflective film of claim 11, wherein the reflective elements each comprises a layer of a metal or a meta material with a thickness of less than about 0.1 micron.

15. The reflective film of claim 14, wherein the reflective elements transmit 20 to 50 percent of the sunlight with a visible light wavelength.

16. The reflective film of claim 14, wherein the metal is aluminum.

17. The reflective film of claim 11, wherein the IR reflecting film further comprises, over each of the reflective elements, a protective coating comprising at least one resist material.

18. A method of fabricating an IR reflective film for use with photovoltaics and building materials, comprising:
    first forming a plurality of structures, each with a recessed surface, on a surface of a substrate formed of a substantially transparent material; and
    second forming a reflective mask on the top surface of the substrate comprising a plurality of reflective elements each disposed on the recessed surface of one of the plurality of structures,
    wherein, after the first and second forming steps, the IR reflecting film reflects at least 50 percent of light received on the surface having a wavelength greater than about 950 nanometers (nm).

19. The method of claim 18, wherein the second forming comprises depositing a layer of a reflective material over the surface, depositing a resist layer over the layer of reflective material at locations matching locations of the reflective elements, and removing portions of the layer of reflective material uncovered by the resist layer.

20. A product formed with to include the IR reflective film of claim 18.

21. The method of claim 18, wherein the recessed surfaces of the structures are linear, round, hexagonal, or square in shape and wherein the reflective elements have a maximum dimension of less than about 400 nm.

22. The method of claim 21, wherein the maximum dimension is less than about 100 nm and light reflectance from the top surface of the substrate of the IR reflecting film is provided by less than 10 percent of a surface area of the top surface.

23. The method of claim 18, wherein the reflective elements each comprises a layer of a metal or a meta material with a thickness of less than about 0.1 micron.

24. The method of claim 23, wherein the reflective elements transmit 20 to 50 percent of the sunlight with a visible light wavelength.

25. The method of claim 23, wherein the metal is aluminum.

\* \* \* \* \*